United States Patent
Engl et al.

(10) Patent No.: US 8,220,973 B2
(45) Date of Patent: Jul. 17, 2012

(54) HOUSING COMPRISING A HOUSING UNDERPART AND METHOD FOR EMITTING ELECTROMAGNETIC RADIATION

(75) Inventors: Moritz Engl, Regensburg (DE); Florin Oswald, Rattenberg (AU)

(73) Assignee: Osram Opto Semiconductors GmbH, Regensburg (DE)

( * ) Notice: Subject to any disclaimer, the term of this patent is extended or adjusted under 35 U.S.C. 154(b) by 883 days.

(21) Appl. No.: 12/198,393

(22) Filed: Aug. 26, 2008

(65) Prior Publication Data

US 2009/0059588 A1    Mar. 5, 2009

(30) Foreign Application Priority Data

Aug. 30, 2007    (DE) .......................... 10 2007 041 133

(51) Int. Cl.
*F21V 5/00* (2006.01)
(52) U.S. Cl. ........ 362/326; 362/317; 362/327; 362/328; 362/329; 362/330; 362/351
(58) Field of Classification Search ............. 62/317–361
See application file for complete search history.

(56) References Cited

U.S. PATENT DOCUMENTS

| | | | |
|---|---|---|---|
| 4,866,849 A * | 9/1989 | Parra | 362/109 |
| 6,711,426 B2 * | 3/2004 | Benaron et al. | 362/572 |
| 2004/0061433 A1 | 4/2004 | Izuno et al. | |
| 2005/0013562 A1 | 1/2005 | Tatehata et al. | |
| 2005/0242355 A1 * | 11/2005 | Guenther et al. | 257/82 |
| 2006/0193145 A1 | 8/2006 | Eichhorn et al. | |
| 2007/0086148 A1 | 4/2007 | Schwenkschuster et al. | |
| 2007/0252771 A1 * | 11/2007 | Maezawa et al. | 361/818 |

FOREIGN PATENT DOCUMENTS

| | | |
|---|---|---|
| DE | 103 15 131 | 10/2004 |
| DE | 102005011355 | 9/2006 |
| DE | 102005059524 | 4/2007 |
| DE | 102006005299 | 8/2007 |

* cited by examiner

*Primary Examiner* — William Carter
(74) *Attorney, Agent, or Firm* — Fish & Richardson P.C.

(57) ABSTRACT

A housing includes a housing underpart, the housing underpart being provided with a housing cavity. The housing cavity comprises an opening on one housing side and, on the floor of the cavity, contains an electromagnetic radiation emitting semiconductor chip. A cover that is at least partially transparent to the electromagnetic radiation covers the housing cavity. A method for emitting electromagnetic radiation in a preferred direction is also disclosed.

17 Claims, 4 Drawing Sheets

PRIOR ART

HOUSING COMPRISING A HOUSING UNDERPART AND METHOD FOR EMITTING ELECTROMAGNETIC RADIATION

CROSS-REFERENCE TO RELATED APPLICATION

Under 35 U.S.C. §119, this application claims the benefit of a foreign priority of German Patent Application 10 2007 041 133.4, filed Aug. 30, 2007, whose disclosure content is hereby incorporated by reference.

TECHNICAL FIELD

The invention is related to a housing for an optoelectronic component that emits electromagnetic radiation when operating, the housing being prevented from emitting lateral radiation. A method for emitting electromagnetic radiation in a preferred direction is also described.

BACKGROUND

Electromagnetic radiation emitting optoelectronic components have a very broad field of application at present. Within a given application, the color, output and mounting characteristics of such an optoelectronic component will vary widely. It therefore makes sense to provide each optoelectronic component with a housing shape, housing type and/or housing assembly specific to the application. LEDs (light emitting diodes), in particular, also known as light diodes or luminescent diodes, are considered here to be electromagnetic radiation emitting optoelectronic components.

LEDs are being used to an ever-greater extent in floodlights or projection applications. An example of a floodlight in which electromagnetic radiation emitting LEDs are used is described in DE 103 15 131 A1. The device in question is a motor vehicle headlight in which a plurality of semiconductor chips is disposed in a common housing cavity.

White light for floodlight applications is obtained, for example, by chip level conversion. For this purpose, a thin layer of a conversion material is applied to the semiconductor chip right in the production process, thus yielding a white-light chip.

In such floodlight applications, it is desirable for an electromagnetic radiation emitted by the semiconductor chip or chips to be beamed into a predetermined, narrow solid angle with the highest possible radiation density. Since these floodlight applications are steadily gaining influence in the automotive industry, vehicle headlights, especially low beam lamps, are already being made with LEDs today. In this application, LED manufacturers must ensure that the light does not deviate from a desired radiation angle, or that the light intensity outside the preferred radiation angle is sharply attenuated, for example by means of special devices. The underlying consideration here is the specific radiation characteristic that headlights must have in traffic, particularly in order to ensure that oncoming vehicles are not blinded by the arrangement of the headlights. One current solution is the use of optics such as projection lenses to project beam cones onto a desired plane.

A disadvantage of this approach is that in such applications, irregularities in the radiation characteristic of the LED used may be amplified and thus become especially troublesome. In this connection, there is a need for components that are designed specifically for such applications in terms of their radiation properties. Known from Patent Application DE 10 2005 059524 A1 is a housing assembly in which a housing base body having a recess is disposed on at least one chip mounting surface. At least one outer surface of the base body, on the radiation side of the housing and adjacent to the recess, is provided with a screening layer suitable for screening out electromagnetic radiation.

A further disadvantage of the known prior art is that a cover to protect the semiconductor chips and the bonding wiring inside the housing cavity is connected to the housing underpart by an adhesive material. In the edge regions of the housing underpart, this adhesive material forms a bead as a result of the production process. Light is optically coupled into the cover through this bead and leaves it only upon reaching the side surfaces of the cover. The cover functions as a sort of a light guide. Because the cover is not ground to be planar, the incoupled light is refracted every which way by the side surfaces of the cover, resulting in the undesired emission of light, including emission deviating from a preferred emission direction.

SUMMARY

This disclosure describes a housing for an optoelectronic component emitting electromagnetic radiation, by means of which housing, through technically simple measures, the radiation characteristic is improved in comparison to known housings and light that is emitted orthogonally to the main emission direction is attenuated or absorbed. This light can, for example, be maximally attenuated or absorbed. This means that in such cases, if at all possible, no light at all is emitted orthogonally to the main emission direction.

In other words, interfering scattered light is adequately suppressed by measures that are part of the design of the housing. The housing is intended in particular to be better suited to floodlight and/or projection applications.

According to at least one embodiment of the housing, the housing possesses a housing underpart, the housing underpart being provided with a housing cavity. This housing cavity has an opening to one side of the housing of the LED, for which reason the cavity is also identified as a recess. The floor of the housing cavity is provided for mounting an LED chip, hereinafter referred to as a semiconductor chip. The inner walls of the cavity can be shaped in the manner of a reflector, such that a portion of the electromagnetic radiation emitted by the semiconductor chip is deflected into a desired radiation solid angle by these reflective inner walls.

According to at least one embodiment, a housing comprises a housing underpart, a housing cavity provided within the housing underpart and having an opening formed on one housing side, at least one electromagnetic radiation emitting semiconductor chip disposed in the housing cavity, and a cover that covers the housing cavity and is at least partially transparent to the radiation. The cover is connected to the housing underpart in such a way that the electromagnetic radiation exiting from the side surfaces of the cover is absorbed. A method is also specified in which light from an electromagnetic component is emitted in a preferred direction. The electromagnetic radiation is, for example, absorbed by the housing underpart.

By means of this housing and this method, the emission of electromagnetic radiation from the housing within undesired solid angles is advantageously appreciably reduced or, in the ideal case, is prevented entirely.

In an advantageous configuration, the housing comprises an absorptive material, which in turn is placed in such a way that the absorptive material absorbs the radiation emitted from the side surfaces of the cover. The introduction of this absorptive material, specifically between the side surfaces of the cover and the housing underpart, achieves the effect of absorbing the light coupled into the cover. This prevents the emission of light that deviates from an desired radiation angle.

In an advantageous implementation, the housing underpart is configured as multi-part, a housing base being connected to a housing frame. The frame comprises a frame recess in which the cover is placed. By virtue of this measure, light exiting from the side surfaces of the cover is absorbed by the housing frame itself.

The use of an absorptive adhesive to produce the connection between the cover and the housing frame achieves the effect of preventing light from getting into the cover through the initially described bead, and thus constitutes an advantageous configuration.

In an advantageous implementation, the height of the cover is equal to or less than the height of the frame recess. This achieves the effect that light exiting entirely from the side surfaces is coupled into the housing frame and absorbed by suitable housing material. This is a very effective protective measure that operates to reduce the amount of light outside the desired beam cone.

Coating the side surface with an absorptive material (layer) keeps radiation that is coupled into the cover from exiting. By virtue of this advantageous configuration, no light exits from the side surfaces of the cover, thus, in turn, preventing emission in unwanted directions.

In a further advantageous configuration, the cover is coated with an absorptive layer in the edge region of the top side, i.e., the opposite side from the housing cavity. Since the cover and especially the side surfaces of the cover are not configured as planar, light is able to exit from the side surfaces within all conceivable solid angles. In the ideal case, the housing underpart absorbs all the incident light. In an extreme case, the light may be reflected by the housing underpart. This configuration achieves the effect of further diminishing the region in which light is emitted into the ambient space. Reflected light thus will not exit from anywhere outside a specific radiation area.

In an advantageous manner, the absorptive layer on the top side of the cover is the absorptive material. This measure eliminates a production step, saves on production material and appreciably simplifies the production process.

In a further advantageous configuration, the side surfaces of the cover are coated with an absorptive layer. This absorptive layer, as an addition to placing the cover in the housing frame and placing the absorptive material between the frame and cover, provides an additional improved variant for reducing the amount of light exiting from the side surface of the cover.

In a further advantageous configuration, the cover is optically coupled to the housing underpart. By this measure, light that is coupled into the cover where it is absorbed by virtue of the absorption properties of the housing material, and consequently does not exit from the side surfaces of the cover. In an advantageous configuration, the housing underpart is a ceramic material. The choice of this material brings about increased thermal resistance and ray resistance to the emitted electromagnetic radiation, especially in the ultraviolet region. Taking this idea farther, the material of the housing underpart can also be a synthetic material, which makes it possible to fabricate the housing shape using simple injection and encapsulation techniques. This constitutes a simplified production process, and thus lower production costs.

In a further advantageous configuration, the material of the cover is a glass material and/or a cured silicone material. Particularly for floodlight applications, the cover thus obtains a satisfactory thermal resistance, in addition to being at least partially transparent to the emitted electromagnetic radiation. Such a cover also serves as protection for the semiconductor chip and the wire bonding connections inside the housing cavity.

In a further advantageous configuration, the housing base is made of aluminum nitride, while the housing frame is of aluminum oxide. The use of different materials results in high thermal heat dissipation. The use of different materials serves to optimally adapt heat dissipation by the housing to the specific regions of the housing, the housing base being endowed with a higher heat dissipation coefficient, since the semiconductor chips are mounted there.

In another advantageous configuration, the housing base and the housing frame are made of the same material. In the ideal case, the housing base and the housing frame are one housing part, thus permitting simplified production, for example by injection molding. A synthetic material may be contemplated for this purpose, especially in thermally non-critical applications. This minimizes production costs.

In a further configuration, it is advantageous to grind the side surfaces of the cover angularly. Two variants can be realized in this way. On the one hand, the grinding angle can be selected so that the light exiting from the side surfaces of the cover is deflected toward the housing underpart. If the material is chosen to be absorptive, the light coupled into the cover is attenuated and does not have a disruptive effect. This, in turn, improves the radiation characteristic of the housing. A further grinding variant is an angle that causes the light coupled into the cover to be deflected in the main radiation direction of the LED. This makes it easier to additionally vapor-deposit an absorptive material on the side surfaces, thereby reducing production costs.

The invention further comprises a method for emitting electromagnetic radiation in a preferred direction, the method comprising the following steps:

First, a semiconductor chip is placed in housing cavity provided in a housing underpart of the semiconductor component and open to one side of the housing. In a further step, the housing underpart is covered with an at least partially transparent cover material. In a third production step, the housing underpart is connected to the cover in such a way that radiation exiting laterally from the cover is absorbed.

According to at least one embodiment, the method also comprises the following steps, in the following order:

a) placing at least one semiconductor chip in a housing cavity provided in a housing underpart of the semiconductor component and open to one side of the housing, b) covering the housing underpart with an at least partially transparent cover, c) connecting the cover to the housing underpart in such a way that radiation exiting laterally from the cover is absorbed.

According to at least one embodiment of the here-described method, an absorptive material is additionally placed between the side surfaces of the cover and of the housing underpart.

According to at least one embodiment of the here-described method, the housing underpart is constructed as multi-part and comprises at least one housing frame, and the cover is fitted into the housing frame.

According to at least one embodiment of the here-described method, the side surfaces are angularly ground.

According to at least one embodiment of the here-described method, the absorptive material is applied in part to the top side of the cover, i.e., the opposite side from the housing cavity.

According to at least one embodiment of the here-described method, the material used for the housing underpart is aluminum nitride and/or aluminum oxide.

According to at least one embodiment of the here-described method, glass or heat-resistant silicone is used as cover material.

The invention is described below on the basis of exemplary embodiments with reference to the drawing, in which the representations of like or like-acting elements are identified by the same respective reference numerals. The illustrated elements are not to be considered true to scale, but rather, individual elements may be depicted as exaggeratedly large or in oversimplified form for the sake of better understanding.

DETAILED DESCRIPTION

Figure 1:
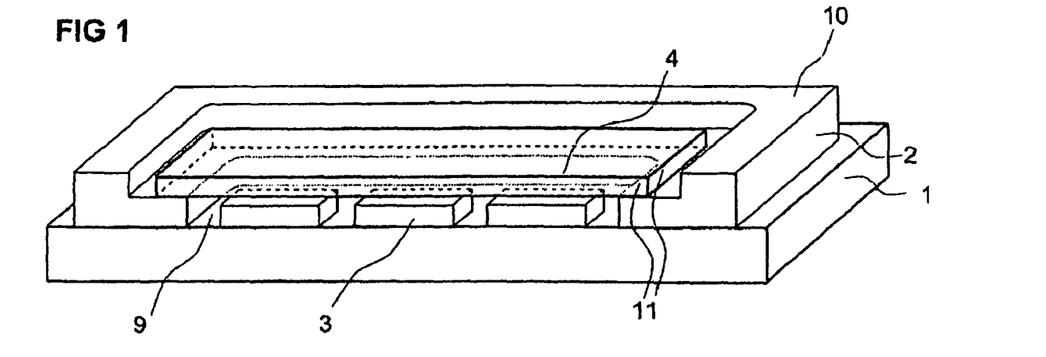
FIG. 1 shows a schematically represented exemplary embodiment of a housing.

FIG. 1 shows a schematically represented exemplary embodiment of the housing. The housing here comprises a housing base 1 and a housing frame 2. Provided in the housing frame is a housing cavity 9. The housing cavity 9 has an opening that is open to a housing side 10. Semiconductor chips 3 are disposed on housing base 1 inside housing cavity 9 and are mechanically connected to the housing base. A cover 4 is fitted into the housing frame 2. Housing frame 2 is equipped for this purpose with housing frame recesses that support the cover 4.

The semiconductor chips 3 emit electromagnetic radiation when operating. This electromagnetic radiation is reflected by the inner surfaces of housing underpart 21, consisting here of housing base 1 and housing frame 2, and is emitted in a preferred radiation direction. The light thus exits from the opening in the housing cavity of housing side 10. To effect their operation, the semiconductor chips 3 are electrically connected, for example by a wire bonding process, to housing leads that are not shown. To protect the wire bonds (not shown) located inside the cavity 9, the cover 4 is positioned in the main beam path of the semiconductor chips 3. The mechanical connection of cover 4 to housing underpart 21, consisting of housing base 1 and housing frame 2, is accomplished for example by gluing the cover to housing underpart 21. Since it is very seldom possible to apply the adhesive so that no bead forms at the edge region of the housing frame recess in housing cavity 9, light is able to be optically coupled into the cover 4 through the bead of adhesive. This coupling into the cover 4 causes the cover 4 to act as a light guide. The incoupled light is able to exit again from the side surfaces 11 of the cover 4. Since the side surfaces 11 of cover 4 normally are not planar, when light exits from the side surfaces it tends to be emitted randomly in all directions. Incorporating the cover 4 into housing underpart 21 in this way achieves the effect that in the ideal case, the incoupled light is completely or maximally absorbed by housing underpart 21. For this purpose, the housing material is preferably a light-absorptive material.

In FIG. 1, housing underpart 21 is multi-part, consisting of housing base 1 and housing frame 2. Also conceivable and not excluded from the inventive idea is a one-part housing underpart 21 of identical or similar design. The resulting simplification of the production method lowers production costs. The best choice for the material of the housing underpart 21 in floodlight applications is a thermally resistant material that conducts heat well, since the temperature range can be as much as −40 to +150 degrees Celsius. It is not inconceivable for the temperature range to be even broader. For housing underpart 21, a ceramic material is advantageous.

Aluminum nitride may be contemplated as the material of the housing base, and aluminum oxide for the housing frame. A synthetic material may also be envisaged as material for the housing underpart 21.

The semiconductor chips 3 can also be replaced by a single semiconductor chip. To increase the luminous intensity, ideally a plurality of semiconductor chips 3 should be disposed in one housing.

The shape of the housing is not limited to that illustrated, but can differ with the semiconductor chip, the housing underpart 21, the temperature conditions and the application.

Figure 2:
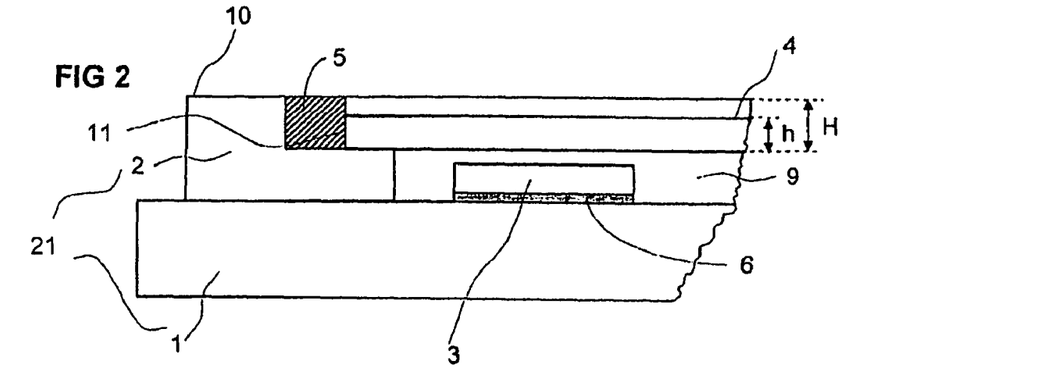
FIG. 2 is a cross section of an improvement of the housing illustrated in FIG. 1.

FIG. 2 is a cross section of an improvement of the housing illustrated in FIG. 1. Here again, a housing base 1 supports a housing frame 2. A cover 4 is placed in a recess of housing frame 2. In addition, a semiconductor component 3 is mounted in the housing cavity 9 by means of an adhesive material 6 and is mechanically connectable to the housing base 1. Due to production tolerances, a gap is present between the side surfaces 11 of the cover 4 and the housing frame 2.

In contrast to FIG. 1, light exiting from side surface 11 is additionally absorbed by reason of the gap being filled with an absorptive material 5. This absorption can act to boost (i.e. add to) the absorption effected by housing underpart 21, and thus to cause more effective attenuation of the laterally exiting light. It is also conceivable, however, for the absorptive material 5 to be the sole absorptive element of the housing, thereby permitting the use of another housing material.

As shown here, the height of the cover h is smaller than the height of the frame recess H. This measure achieves the effect that light exiting entirely from the side surface strikes the housing frame 2 and thus the absorptive material 5.

The absorptive material 5 used is advantageously, for example, an encapsulating material, an epoxy resin, a silicone (including SiC) or an adhesive, it being noted that an adhesive additionally produces a mechanical connection between the cover 4 and the housing underpart 21. The absorptive material 5 can further contain radiation-absorbing particles, consisting, for example, of carbon black.

Figure 3:
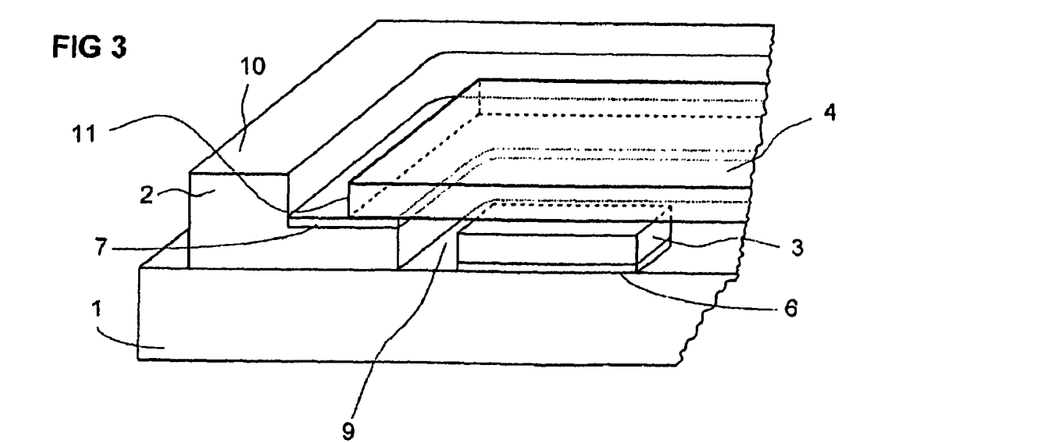
FIG. 3 is an alternative improvement of the housing illustrated in FIG. 1.

FIG. 3 shows an alternative improvement of the housing illustrated in FIG. 1. Since FIG. 3 is very similar to FIG. 2, only the differences with respect to FIG. 2 will be addressed here. Instead of the absorptive material 5 represented in FIG. 2, an absorptive adhesive 7 is incorporated as a mechanical adhesive between cover 4 and housing frame 2. This adhesive 7 prevents the initially described optical coupling of light into the cover 4. The absorptive adhesive 7 can be, for example, dyed epoxy.

Figure 4:
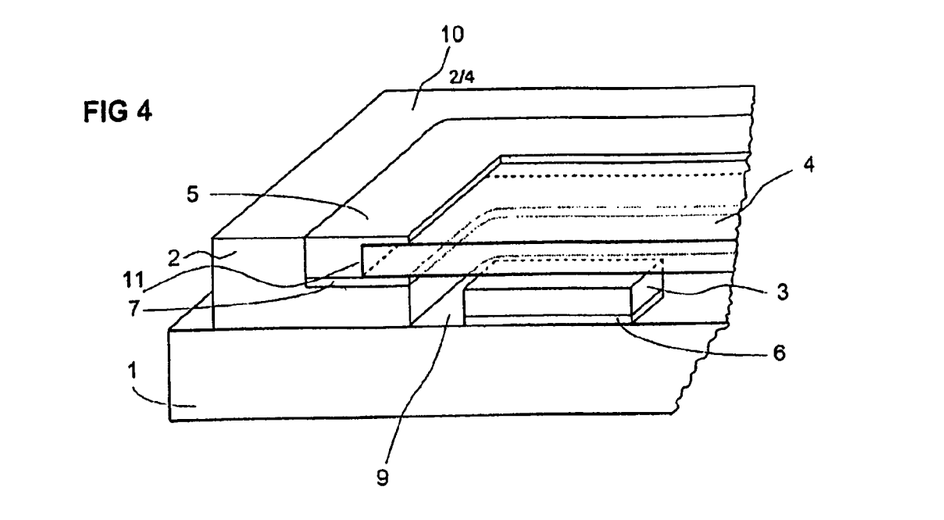
FIG. 4 is an improvement of the housing illustrated in FIG. 3.

Illustrated in FIG. 4 is an improvement of the housing depicted in FIG. 3. Only the differences with respect to the housing illustrated in FIG. 3 will be described below. Depicted here is a combination of absorptive adhesive 7 and absorptive material 5, in which the absorptive material 5 is additionally disposed in the edge region of the top side of the cover 4. The top side of the cover 4 is to be understood here as the top side disposed oppositely from the housing cavity 9.

Since the absorptive material 5 is to be disposed in the gap between the side surface of the cover 4 and the housing frame 2, it is very easy under these circumstances, owing to the stated relationship between the height of the cover h and the frame recess height H, to apply the absorptive material 5 also to the edge region of the top side of cover 4. This effect of this measure is that interfering light reflected by the side surface and emitted in all directions is additionally absorbed by absorptive material on the top side of the cover. Thus, no light is outside the beam cone of the desired radiation characteristic of the housing.

The absorptive material on the top side of the cover 4 is also referred to as a "glob top."

Figure 5:
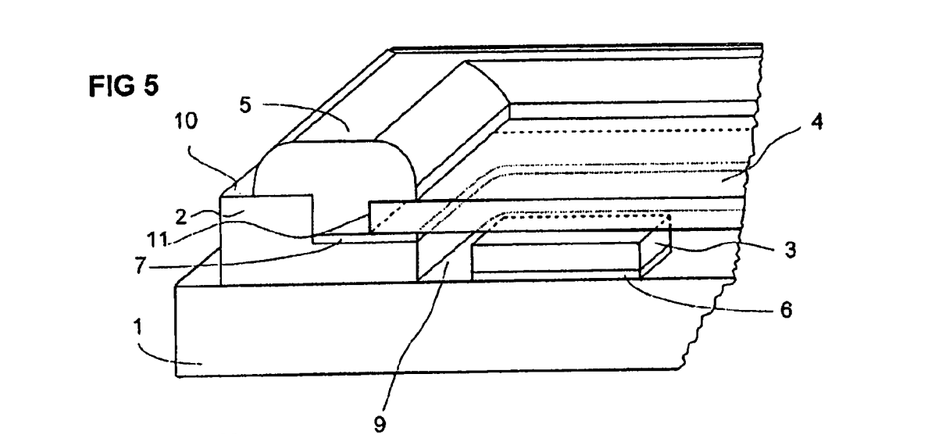
FIG. 5 is an improvement of the housing illustrated in FIG. 3.

FIG. 5 shows an improvement of the housing illustrated in FIG. 3, the difference from FIG. 4 being that in FIG. 5, the absorptive material 5 is "heaped up" on the housing frame 2 and covers not only portions of the top side of the cover 4, but also portions of the top side 10 of the housing frame. By means of this improvement, light that exits from the side surfaces of the cover and is reflected in all directions due to the roughness of the side surfaces 11 is also now absorbed additionally in the edge region of the housing frame 2.

It is also advantageous for the absorptive material 5 to have a set minimum thickness, since if a characteristic minimum thickness for each wavelength is not reached, no absorption will occur in the absorptive material 5.

Figure 6:
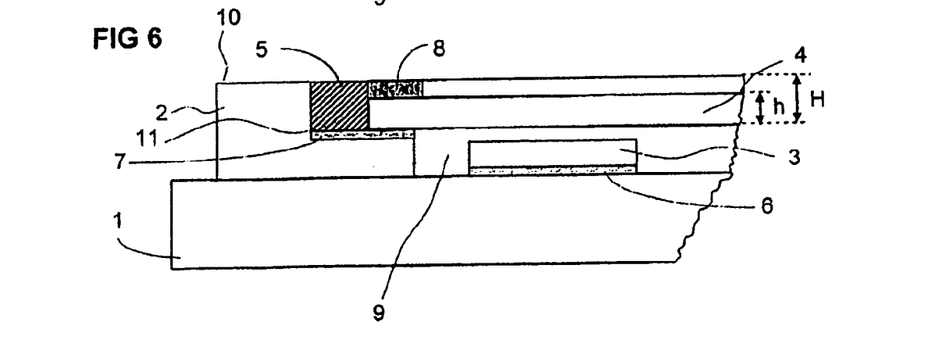
FIG. 6 is a cross section of an improvement of the housing illustrated in FIG. 5.

FIG. 6 shows a cross section of an improvement of the housing illustrated in FIG. 5. In contrast to FIG. 5, in addition to the absorptive material 5 and the absorptive adhesive layer 7, an absorptive layer 8 is placed on the edge regions of the top side of the cover 4, i.e. the opposite side from the housing cavity 9. In similar fashion to the embodiments described in FIGS. 4 and 5, this absorptive layer serves to prevent an increased radiation angle and should not be below a minimum thickness.

Figure 7:
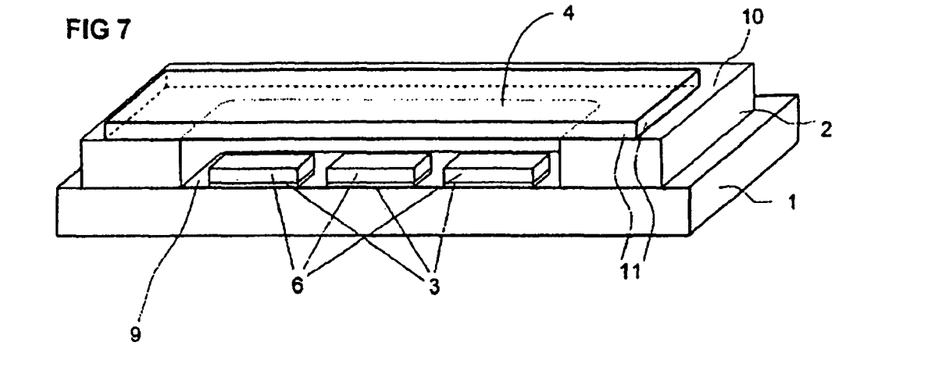
FIG. 7 is an alternative exemplary embodiment of the housing illustrated in FIG. 1 according to prior art.

FIGS. 7 to 10 show an alternative exemplary embodiment of the housing illustrated in FIG. 1. Once again, a housing base 1 and a housing frame 2 are provided, although here, in contrast to the preceding figures, the housing frame 2 has no recess for receiving the cover 4. Unlike in the preceding figures, the cover 4 is placed on the housing frame 2 and is mechanically connected to it. FIG. 7 is an illustration according to prior art.

Figure 8:
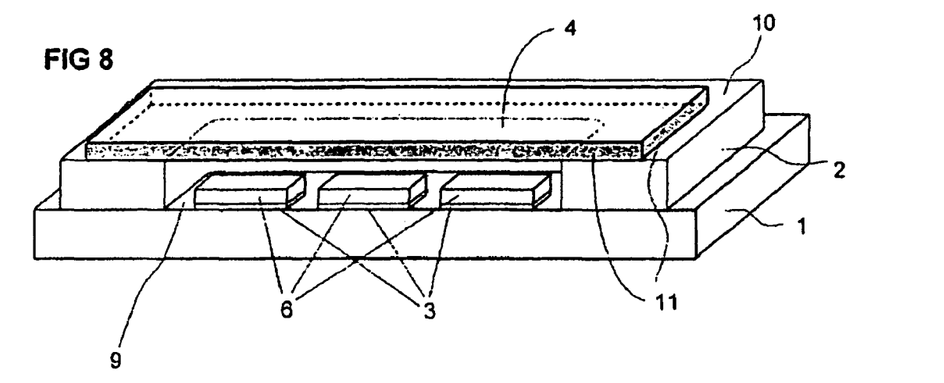
FIG. 8 is an improvement of the housing illustrated in FIG. 7.

Illustrated in FIG. 8 is an improvement of the housing depicted in FIG. 7. In this case, the side surfaces 11 of the cover 4 are additionally coated with an absorptive layer. This measure, once again, prevents light coupled into the cover from exiting from the side surfaces 11 of the cover 4.

Figure 9:
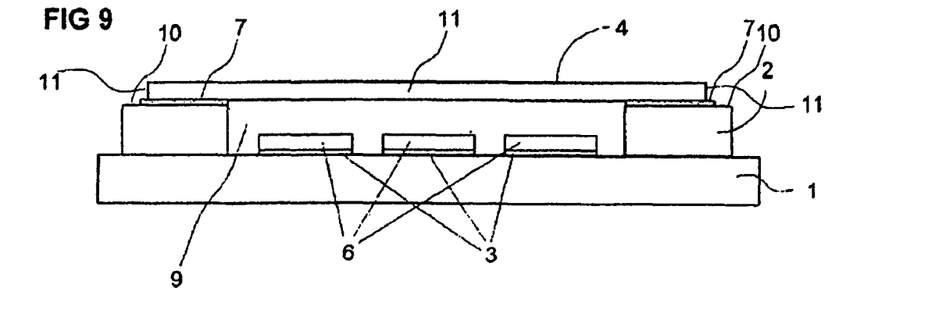
FIG. 9 is a cross section of an improvement of the housing illustrated in FIG. 7.

FIG. 9 shows a cross section of an improvement of the housing depicted in FIG. 7. Here, an absorptive adhesive 7 is provided between the cover 4 and the housing underpart 21. For an explanation of this measure, see the descriptions of FIGS. 4, 5 and 6.

Figure 10:
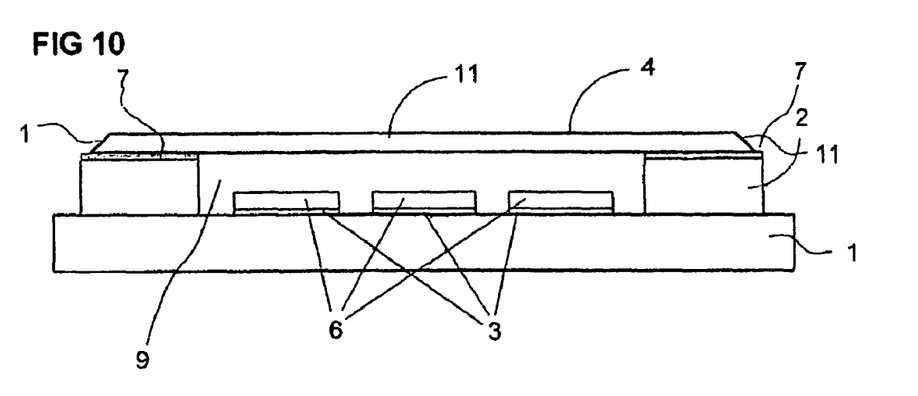
FIG. 10 is a cross section of an improvement of the housing illustrated in FIG. 9.

FIG. 10 is a cross section of an improvement of the housing depicted in FIG. 9. In contrast to FIG. 9, here the side surfaces 11 of the cover 4 are cut angularly. This bevel can theoretically be made at two angles. In a first variant, not shown here, the angle is selected such that the side surfaces 11 can, in an additional production step, be provided with an absorptive layer 8 in order to absorb the light exiting from the side surfaces 11 of the cover 4. The angle in this case is designed to permit the use of a simplified vapor deposition process.

In a second variant, the one illustrated here, the angle is selected such that the light coupled into the cover 4 is deflected into the housing frame 2 or the housing underpart 21, where it is absorbed by virtue of the absorption properties of the housing material, and consequently does not exit.

The methods represented in FIGS. 1 to 10 can be combined at will. Unless otherwise noted, statements regarding and examples of materials or geometries of the elements illustrated in the figures apply to the other figures, as well.

A glass plate is used exemplarily as the cover for the chips, since it has a high temperature stability. It is further possible to employ other temperature-stable, transparent materials, particularly silicon for infrared applications or silicon carbide (SiC).

The invention is not limited to the exemplary embodiments by the description of it with reference thereto. Rather, the invention encompasses any novel feature and any combination of features, including in particular any combination of features recited in the claims, even if that feature or combination itself is not explicitly mentioned in the claims or exemplary embodiments.

What is claimed is:

1. A housing comprising:
    a housing underpart;
    a housing cavity defined within the housing underpart; the housing cavity having an opening extending through one side of the housing;
    at least one electromagnetic radiation emitting semiconductor chip disposed in the housing cavity; and
    a transparent cover that covers the housing cavity, the cover connected to the housing underpart in such a way that the electromagnetic radiation exiting from the side surfaces of the cover is absorbed
    wherein the at least one electromagnetic radiation-emitting semiconductor chip is mounted in the housing cavity by means of an adhesive material and a gap is present between the at least one electromagnetic radiation-emitting semiconductor chip and the transparent cover.

2. The housing as in claim 1, wherein the housing comprises an absorptive material placed in such a way that the absorptive material absorbs the radiation emitted from the side surface of the cover.

3. The housing as in claim 2, wherein the housing underpart comprises at least one housing base and one housing frame, and the housing frame contains a frame recess in which the cover is disposed, the cover connected to the housing frame by an absorptive adhesive.

4. The housing as in claim 3, wherein the absorptive material is disposed between the side surface of the cover and the housing frame.

5. The housing as in claim 3, wherein the height of the cover is equal to or less than the height of the frame recess.

6. The housing as in claim 3, wherein an edge region of a top side of the cover opposite to the housing cavity is coated with an absorptive layer.

7. The housing as in claim 3, wherein the side surfaces of the cover are coated with an absorptive layer.

8. The housing as in claim 3, wherein material of the housing frame comprises aluminum oxide and material of the housing base comprises aluminum nitride.

9. The housing as in claim 1, wherein the housing underpart comprises at least one housing base and one housing frame and the housing frame contains a frame recess in which the cover is disposed, the absorptive material being disposed between the side surface of the cover and the housing frame and the absorptive material being an adhesive that produces a mechanical connection between the cover and the housing underpart.

10. The housing as in claim 1, wherein the cover is optically coupled to the housing underpart.

11. The housing as in claim 1, wherein the cover material is a glass or a cured silicone and is thermally resistant to the radiation from the semiconductor chip.

12. The housing as in claim 3, wherein the material of the housing frame and of the housing base is a ceramic or a synthetic material that is thermally resistant to the radiation from the semiconductor chip.

13. The housing as in claim 1, wherein material of the housing underpart comprises aluminum nitride.

14. The housing as in claim 1, wherein the side surfaces of the cover are ground at an angle such that the radiation coupled into the cover is deflected into the housing underpart.

15. The housing as in claim 14, wherein the side surfaces of the cover are coated with an absorptive layer.

16. The housing as in claim 1, wherein the side surfaces of the cover are ground at an angle such that the radiation coupled into the cover is deflected into the body.

17. A housing comprising:
a housing underpart defining a single housing cavity within the housing underpart, the single housing cavity having an opening extending through one side of the housing;
a plurality of electromagnetic radiation-emitting semiconductor chips disposed in the housing cavity ; and
a transparent cover that covers the housing cavity, the cover being connected to the housing underpart in such a way that the electromagnetic radiation exiting from a side surface of the cover is absorbed
wherein the at least one electromagnetic radiation-emitting semiconductor chip is mounted in the housing cavity by means of an adhesive material and a gap is present between the at least one electromagnetic radiation-emitting semiconductor chip and the transparent cover.

* * * * *

UNITED STATES PATENT AND TRADEMARK OFFICE
CERTIFICATE OF CORRECTION

| | |
|---|---|
| PATENT NO. | : 8,220,973 B2 |
| APPLICATION NO. | : 12/198393 |
| DATED | : July 17, 2012 |
| INVENTOR(S) | : Moritz Engl et al. |

It is certified that error appears in the above-identified patent and that said Letters Patent is hereby corrected as shown below:

In Claim 1, column 8, line 39, after "from" delete "the".

Signed and Sealed this
Thirtieth Day of October, 2012

David J. Kappos
*Director of the United States Patent and Trademark Office*